United States Patent [19]
Saiki

[11] Patent Number: 5,543,793
[45] Date of Patent: Aug. 6, 1996

[54] ANALOG/DIGITAL CONVERSION SYSTEM

[75] Inventor: Nobuyuki Saiki, Itami, Japan

[73] Assignee: Mitsubishi Denki Kabushiki Kaisha, Tokyo, Japan

[21] Appl. No.: 257,847

[22] Filed: Jun. 10, 1994

[30] Foreign Application Priority Data

Jun. 29, 1993 [JP] Japan .................................. 5-158698

[51] Int. Cl.$^6$ .................................................. H03M 1/12
[52] U.S. Cl. ........................................................ 341/155
[58] Field of Search .................................... 341/155, 156, 341/158, 161

[56] References Cited

U.S. PATENT DOCUMENTS 4,218,675  8/1980  Shaw et al. .............................. 341/156

Primary Examiner—Brian K. Young
Attorney, Agent, or Firm—Lowe, Price, LeBlanc & Becker

[57] ABSTRACT

In an analog/digital conversion system, wherein two analog voltages providing objects of conversion and a plurality of reference voltages are sequentially compared by two comparators. The reference voltages are generated by a single ladder resistor, which is configured to apply the reference voltages to one of the comparators while the analog voltages are applied to the other comparator. The two analog voltages are thus converted into digital data in parallel.

4 Claims, 3 Drawing Sheets

ANALOG/DIGITAL CONVERSION SYSTEM

BACKGROUND OF THE INVENTION

1. Field of the Invention

The present invention relates to an analog/digital conversion system for converting an analog voltage into digital data.

2. Description of Related Art

FIG. 1 is a block diagram showing a major part of a conventional analog/digital conversion system of sequential comparison type. An analog voltage ANV to be converted into a digital form is applied to one input terminal of a comparator 3 through a switch $2A_1$. A reference voltage $V_{REF}$ produced from a ladder resistor 4 having a tap decoder not shown is applied to the other input terminal of the comparator 3 through a switch $2A_2$. The output of the comparator 3 is applied to an analog/digital conversion register (hereinafter referred to as "the A/D conversion register") 7.

The value of the A/D conversion register 7 is supplied to the ladder resister 4, and is also outputted as an 8-bit digital data DD externally. One terminal of tile ladder resistor 4 is connected to a power supply $V_R$ providing a reference power supply, and the other terminal thereof is connected to the ground potential $V_S$. The comparator 3 and the A/D conversion register 7 are controlled by an analog/digital control circuit (hereinafter referred to as "the A/D control circuit") 9. The switches $2A_1$, $2A_2$ are adapted to perform the switching operation in complementary fashion under the control of a sample clock #φ, φ sent from the A/D control circuit 9, respectively.

Now, the operation of this analog/digital conversion system will be explained. In the case where an analog voltage is to be converted into 8-bit digital data, first, the A/D control circuit 9 begins the analog/digital conversion operation, clearing all the bits of the A/D conversion register 7 to "0". Then, the most significant bit of the A/D conversion register 7 is set to "1". The switch $2A_1$ is turned on by an L-level sample clock #φ to apply the analog voltage ANV to the comparator 3. The switch $2A_2$ is turned on by an H-level sample clock φ, so that the reference voltage $V_{REF}$ is applied from the ladder resistor 4 to the comparator 3. The reference voltage $V_{REF}$ thus produced is at an output level corresponding to the value of the A/D conversion register 7.

The comparator 3 is compares the magnitude of the analog voltage ANV with that of the reference voltage $V_{REF}$, and applies the result of comparison to the A/D conversion register 7. In the case where the analog voltage ANV is relatively large, the most significant bit which has been set to "1" is left intact. When the analog voltage ANV is relatively small, the most significant bit is turned to "0". The second most significant bit of the A/D conversion register 7 is then set to "1" and in a manner similar to the above process, the magnitude is compared between the analog voltage ANV and the reference voltage $V_{REF}$ by the comparator 3, thereby establishing the second most significant bit to "1" or "0". In this manner, comparing operations are performed eight times for the all bits, whereby the A/D conversion register 7 produces the value DD by converting the analog voltage ANV into 8-bit digital data.

The source potential $V_R$ applied to the ladder resistor 4 and the reference voltage $V_{REF}$ have the following relationship, in the case where the value n of the A/D conversion register 7 is expressed in decimal notation:

When n=0, $$V_{REF}=0 \quad (1)$$

When n=1 to 255

$$V_{REF}=V_R/\{256(n-0.5)\} \quad (2)$$

Also, the relationship of the reference voltage $V_{REF}$ to the value of the A/D conversion register 7 is given in Table 1.

TABLE 1

| | VALUE OF A/D CONVERSION REGISTER | REFERENCE VOLTAGE $V_{REF}$ |
|---|---|---|
| START OF COMPARISON | 0 0 0 0 0 0 0 0 | 0 |
| FIRST TIME COMPARISON | 1 0 0 0 0 0 0 0 | $V_R/2 - V_R/512$ |
| SECOND TIME COMPARISON | 1 0 0 0 0 0 0 | $V_R/2 \pm V_R/4 - V_R/512$ |
| THIRD TIME COMPARISON | 1 0 0 0 0 0 | $V_R/2 \pm V_R/4 \pm V_R/8 - V_R/512$ |
| . . . | | |
| SEVENTH TIME COMPARISON | 1 | |
| END OF EIGHT TIME COMPARISON | | |

In a conventional analog/digital conversion system, a switch is operated in accordance with a sample clock to apply an analog voltage and a reference voltage alternately to a comparator. As long as the analog voltage is applied to the comparator, a ladder resistor is in the stand by state without outputting, the reference voltage, resulting in a low utilization rate. For this reason, in the case where each of two analog voltages is to be converted into digital data, two sets of ladder resistors are required. This remarkably increases the area in a pattern occupied by the ladder resistors, making it impossible to reduce the size of the analog/digital conversion system.

SUMMARY OF THE INVENTION

The invention has been developed in order to obviate the above-mentioned problems, and an object thereof is to provide an analog/digital conversion system capable of converting two analog voltages into digital data using a single ladder resistor.

According to one aspect of the invention, there is provided an analog/digital conversion system comprising a first comparator for sequentially comparing a first analog voltage and a reference voltage with each other, a first register for establishing and storing digital data in accordance with the result of comparison in the first comparator, a second comparator for comparing a second analog voltage with the reference voltage, a second register for establishing and storing digital data in accordance with the result of comparison by the second comparator, a ladder resistor for applying the reference voltages to the first and second comparators, and means for applying to one of the comparators the reference voltages during the period when the other comparator is supplied with the corresponding analog voltage.

According to another aspect of the invention, there is provided an analog/digital conversion system configured in such a manner that a first control circuit and a second control circuit produce a clock for taking the timing of switching the input of the analog voltages or the reference voltages to the comparators.

During the period when the first analog voltage is applied to the first comparator (for example, when the sample clock sent from the control circuit is at L(–) level), therefore, the reference voltage is applied from the ladder resistor to the second comparator. The reference voltage is applied from the ladder resistor to the first comparator during the period when the second analog voltage is applied to the second comparator (for example, when the sample clock sent from the control circuit is at H(–) level. As a result, the utilization rate of the ladder resistor is improved, and only a single ladder resistor is required for converting each of the two analog voltages into digital data, which reduces the area in a pattern occupied by the ladder resistor.

According to still another aspect of the invention, there is provided an analog/digital conversion system in which a single control circuit is provided for controlling first and second comparators as well as first and second registers. This reduces the pattern area occupied by the control circuit, resulting in reduction of a size of the system.

The above and further objects and features of the invention will more fully be apparent from the following detailed description with accompanying drawings.

DESCRIPTION OF THE PREFERRED EMBODIMENTS

Figure 1:
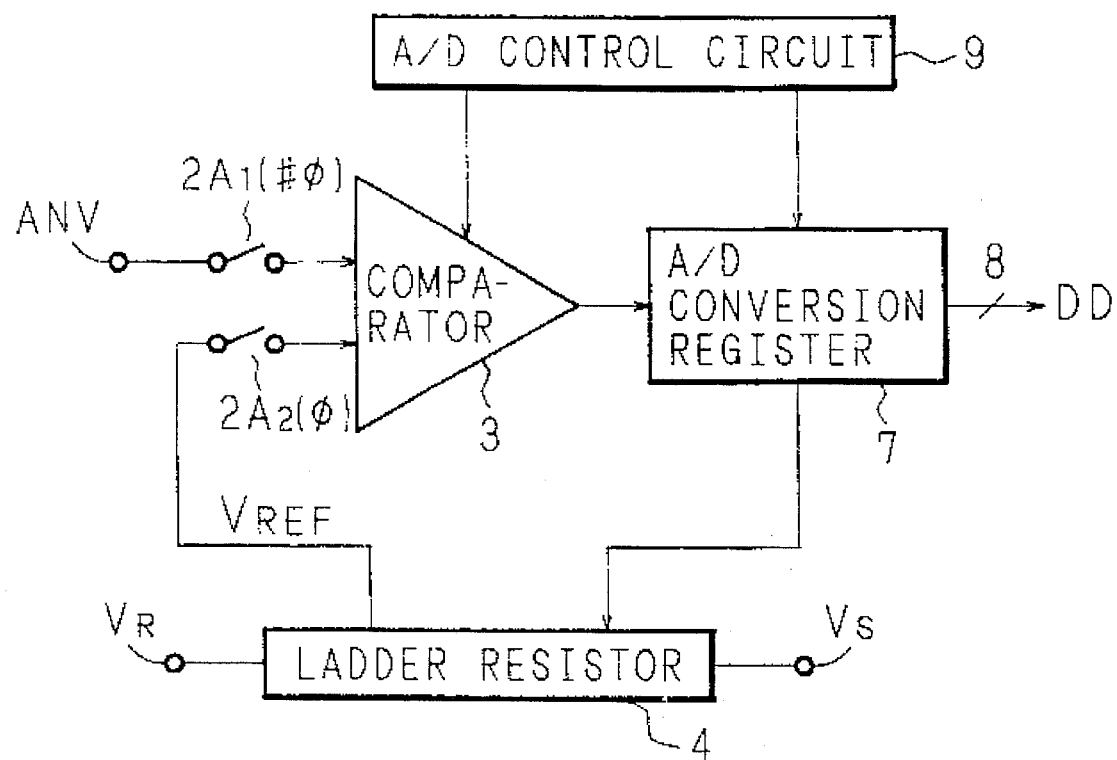
FIG. 1 is a block diagram showing a major configuration of a conventional analog/digital conversion system.

The invention will be described below with reference to embodiments thereof shown in the drawings.

Figure 2:
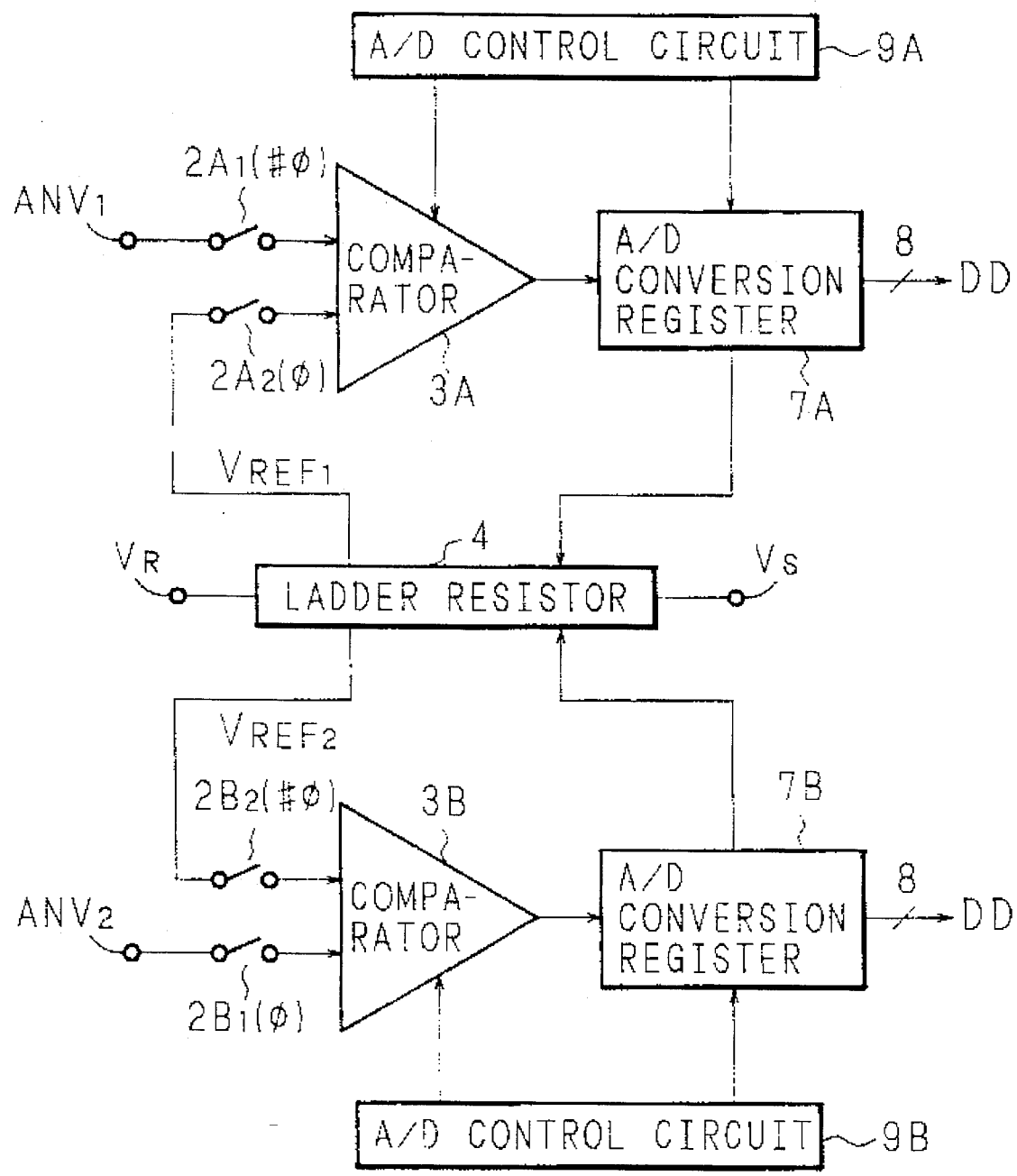
FIG. 2 is a block diagram showing a major configuration of an analog/digital conversion system according to the present invention.

The configuration of an analog/digital conversion system according to the invention is shown in the block diagram of FIG. 2. An analog voltage $ANV_1$, on which analog/digital conversion is effected, is applied to one of input terminals of a first comparator 3A through a switch $2A_1$. A reference voltage $V_{REF1}$ produced from a single ladder resistor 4 is applied through a switch $2A_2$ to the other input terminal of the first comparator 3A. The ladder resistor 4 includes a tap decoder not shown. The output of the first comparator 3A providing the result of comparison therein is applied to a first A/D conversion register 7A. The value of the A/D conversion register 7A is applied to the ladder resistor 4. The comparator 3A and the A/D conversion register 7A are controlled by an A/D control circuit 9A. One of terminals of the ladder resistor 4 is connected to the source potential $V_R$ of a reference power supply, and the other terminal is connected to the ground potential $V_S$ of the reference power supply.

A second analog voltage $ANV_2$ is applied through a switch $2B_1$ to one of input terminals of a second comparator 3B. A reference voltage $V_{REF2}$ produced from the ladder resistor 4 is applied to the other input terminal of the second comparator 3B through a switch $2B_2$. The output of the comparator 3B providing the result of comparison therein is applied to a second A/D conversion register 7B. The value of the A/D conversion register 7B is applied to the ladder resistor 4. The comparator 3B and the A/D conversion register 7B are controlled by a second A/D control circuit 9B. The switches $2A_1$, $2A_2$ as well as the switches $2B_1$, $2B_2$ are operated by the L-level #ϕ and H-level ϕ of the sample clock sent from the A/D control circuit 9A and the A/D control circuit 9B, respectively. More specifically the switches $2A_2$, $2B_1$ are operated by the H-level sample clock ϕ, and the switches $2A_1$, $2B_2$ are operated by the L-level sample clock #ϕ, so that the switches $2A_2$, $2B_1$ are operated in complementary fashion with respect to the switches $2A_1$, $2B_2$.

The operation of the analog/digital conversion system configured as described above will be explained. In the case where an analog voltage is to be converted into 8-bit digital data, first, the A/D control circuit 9A controls the start of the analog/digital conversion operation to clear all the bits of the A/D conversion register 7A to "0" Next, an "1" is set in the most significant bit of the A/D conversion register 7A. The L-level sample clock #ϕ turns on the switch $2A_1(=(2A_1))$ to supply the analog voltage $ANV_1$ to the comparator 3.

The H-level sample clock #ϕ turns on the switch $2A_2$ to apply the reference voltage $V_{REF1}$, which is supplied from the ladder resistor 4 in accordance with the value of the A/D conversion register 7A, to the comparator 3A. The comparator 3A compares the analog voltage $ANV_1$ with the reference voltage $V_{REF1}$ in magnitude, and the result of comparison is applied to the A/D conversion register 7A. In the case where the analog voltage $ANV_1$ is relatively large, the most significant bit set to "1" is left intact. When the analog voltage $ANV_1$ is relatively small, the most significant bit is set to "0".

The second most significant bit of the A/D conversion register 7A is then set to "1", and as in the preceding case, the analog voltage $ANV_1$ is compared with the reference voltage $V_{REF1}$ by the comparator 3A, so that the second most significant bit is finally set to "1" or "0" as the case may be. Similar procedures are taken to make eight comparison operations for all the bits including the least significant bit, and the 8-bit value DD of the analog voltage 1A as digitally converted is produced from the A/D conversion register 7A.

In parallel to the analog/digital conversion operations described above, the switches $2B_1$, $2B_2$ are controlled in accordance with the sample clock φ, #φ. The comparator 3B repetitively compares the analog voltage $ANV_2$ with the reference voltage $V_{REF2}$ sent from the ladder resistor 4. By performing eight comparison operations starting from the most significant bit to the least significant bit, the digitally- The reference voltage $V_{REF1}$ the reference voltage $V_{REF2}$ as related to the source potential $V_R$ of the reference power supply is given as follows, in the case where the value n of the A/D conversion register 7A the A/D conversion register 7B is expressed in decimal notation:

When n=0, $$V_{REF}=0$$

When n=1 to 255

$$V_{REF}=V_R/\{256(n-0.5)\}$$

Also, the relationship between the value of the A/D conversion register 7A, and the reference voltage $V_{REF1}$, $V_{REF2}$ is shown in Table 2.

TABLE 2

| | VALUE OF A/D CONVERSION REGISTER | REFERENCE VOLTAGE $V_{REF1}(V_{REF2})$ |
|---|---|---|
| START OF COMPARISON | 0 0 0 0 0 0 0 0 | 0 |
| FIRST TIME COMPARISON | 1 0 0 0 0 0 0 0 | $V_R/2 - V_R/512$ |
| SECOND TIME COMPARISON | 1 0 0 0 0 0 0 | $V_R/2 \pm V_R/4 - V_R/512$ |
| THIRD TIME COMPARISON | 1 0 0 0 0 0 | $V_R/2 \pm V_R/4 \pm V_R/8 - V_R/512$ |
| . | | |
| . | | |
| SEVENTH TIME COMPARISON | 1 | |
| END OF EIGHT TIME COMPARISON | | | converted 8-bit value DD of the analog voltage $ANV_2$ is produced from the A/D conversion register 7B.

In other words, as long as the reference voltage $V_{REF1}$ is applied to the comparator 3A during the H-level period of the sample clock φ, the analog voltage $ANV_2$ is applied to the comparator 3B. Also, while the analog voltage $ANV_1$ is applied to the comparator 3A during the L-level period of the sample clock #φ, the reference voltage $V_{REF2}$ is applied to the comparator 3B. As a result, the utilization rate of the ladder resistor 4 is improved. Further, in the case where two analog voltages $ANV_1$, $ANV_2$ are subjected to analog/digital conversion, a single ladder resistor 4 can be used, which remarkably reduces the pattern area occupied by the ladder resistor 4.

In addition, in view of the facts that the comparator 3A and the A/D conversion register 7A are controlled by the A/D control circuit 9A, and that the comparator 3B and the A/D conversion register 7B are controlled by the A/D control circuit 9B, the comparison operation by the comparator 3A can be performed in parallel to that by the comparator 3B from the most significant bit to the least significant bit. Also, the comparison operation by the comparator 3A from a predetermined bit to the least significant bit can be performed in parallel to the comparison operation from the most significant bit to a predetermined bit by the comparator 3B.

Figure 3:
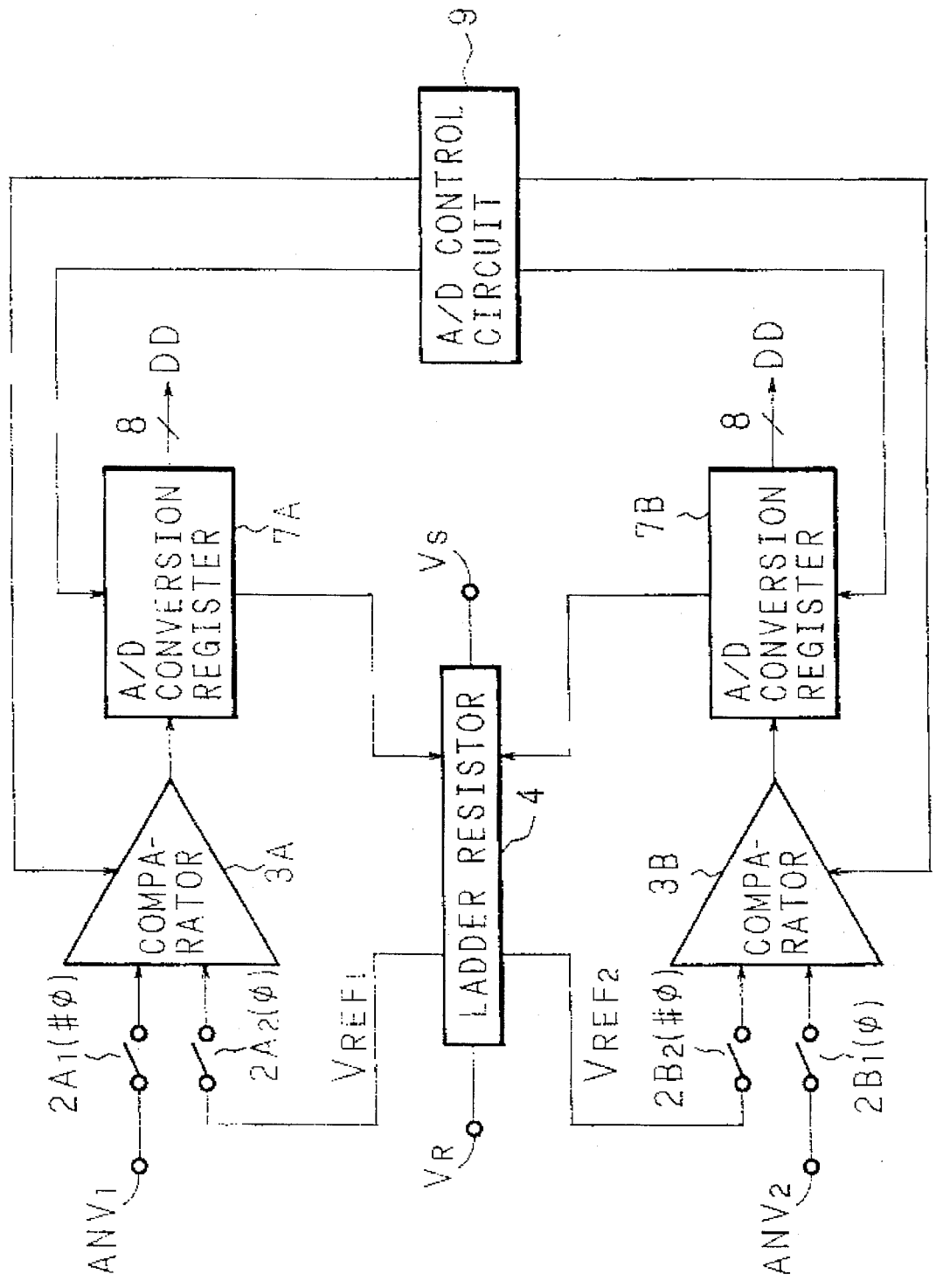
FIG. 3 is a block diagram showing a major configuration of an analog/digital conversion system according to another embodiment of the invention.

A configuration of an analog/digital conversion system according to another embodiment of the invention is shown in the block diagram of FIG. 3. A single A/D control circuit 9 is adapted to control a first comparator 3A, a first A/D conversion register 7A, a second comparator 3B and a second A/D conversion register 7B. The other structures are similar to those of the analog/digital conversion system shown in FIG. 2. The same or similar parts and portions bear the same reference numbers, and will not be described below.

The analog/digital conversion system according to this embodiment performs the analog/digital conversion operation similar to that described above. The comparison operation of the comparator 3A can be performed in parallel to that of the comparator 3B. Since the single A/D control circuit 9 controls the comparators 3A, 3B, the area in the pattern occupied by both the ladder resistor and the A/D control circuit can be reduced, thereby reducing the size of the analog/digital conversion system even more.

It will thus be understood from the foregoing detailed description that in the analog/digital conversion system according to the invention, while a reference voltage produced from a ladder resistor is not applied to one comparator, it is applied to the other comparator, thereby making it possible to improve the utilization rate of the ladder resistor. Also, two analog voltages can be converted into digital data in parallel using a single ladder resistor. Further, the reduced area in the pattern occupied by the ladder resistor reduces the size of the analog/digital conversion system.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An analog/digital conversion system comprising:

a first comparator for sequentially comparing a first analog voltage to be converted and a plurality of reference voltages;

a first register for storing digital data resulting from comparison by said first comparator;

a first control circuit for controlling start of comparison operation by said first comparator and output of said digital data from said first register;

a second comparator for sequentially comparing a second analog voltage to be converted and a plurality of reference voltages;

a second register for storing digital data resulting from comparison by said second comparator;

a single second control circuit for controlling start of comparison operation by said second comparator and output of said single digital data from said second register;

a ladder resistor for generating said reference voltages and applying said reference voltages to said first and second comparators; and means for applying outputs of said ladder resistor to one of said first and second comparators during a period when said analog voltage is applied to the other of said first and second comparators.

2. An analog/digital conversion system according to claim 1, wherein said first control circuit and said second control circuit produce clocks for taking a timing for changing input to said comparators between said analog voltages and said reference voltages.

3. An analog/digital conversion system comprising:

a first comparator for sequentially comparing a first analog voltage to be converted and a plurality of reference voltages;

a first register for storing digital data resulting from comparison by said first comparator;

a second comparator for sequentially comparing a second analog voltage to be converted and a plurality of reference voltages;

a second register for storing digital data resulting from comparison by said the second comparator;

a control circuit for controlling start of comparison operation by said first comparator and said second comparator and outputs of digital data from said first and second registers;

a single ladder resistor for generating said reference voltages and applying said single reference voltages to said first and second comparators; and means for applying the outputs from said ladder resistor to one of said first and second comparators during a period when said analog voltage is applied to the other of said first and second comparators.

4. An analog/digital conversion system according to claim 3, wherein said control circuit produces clocks for taking a timing for changing input to said comparators between said analog voltages and said reference voltages.

* * * * *